(12) United States Patent
Chiu et al.

(10) Patent No.: US 10,734,354 B2
(45) Date of Patent: Aug. 4, 2020

(54) SEMICONDUCTOR DEVICE INCLUDING OPTICALLY CONNECTED WAFER STACK

(71) Applicant: SANDISK INFORMATION TECHNOLOGY (SHANGHAI) CO., LTD., Shanghai (CN)

(72) Inventors: Chin-Tien Chiu, Taichung (TW); Ye Bai, Shanghai (CN); Shineng Ma, Shanghai (CN); Ting Liu, Shanghai (CN); Binbin Zheng, Shanghai (CN); Lei Shi, Shanghai (CN); Hem Takiar, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 41 days.

(21) Appl. No.: 15/906,102

(22) Filed: Feb. 27, 2018

(65) Prior Publication Data
US 2019/0198479 A1 Jun. 27, 2019

(30) Foreign Application Priority Data
Dec. 27, 2017 (CN) .......................... 2017 1 1442213

(51) Int. Cl.
| | | |
|---|---|---|
| H01L 25/075 | (2006.01) | |
| H01L 25/16 | (2006.01) | |
| H01L 31/12 | (2006.01) | |
| H01L 23/522 | (2006.01) | |
| H01L 23/528 | (2006.01) | |
| H01L 25/065 | (2006.01) | |
| H04B 10/27 | (2013.01) | |
| G01R 31/27 | (2006.01) | |

(52) U.S. Cl.
CPC ...... *H01L 25/0652* (2013.01); *H01L 25/0657* (2013.01); *H01L 25/167* (2013.01); *H01L 31/125* (2013.01); *G01R 31/275* (2013.01); *H01L 2225/06534* (2013.01); *H01L 2225/06555* (2013.01); *H04B 10/27* (2013.01)

(58) Field of Classification Search
CPC .............. H01L 25/167; H01L 25/0657; H01L 2224/24145; H01L 2224/32145; H01L 2221/68313; H01L 2224/75753; G02B 6/43; G02B 6/428; G02B 6/4206; H05K 1/0274; H05K 2201/10121; H05K 2201/10515; H05K 1/144; G01R 31/311; G01R 31/275
See application file for complete search history.

(56) References Cited

U.S. PATENT DOCUMENTS

| | | | | |
|---|---|---|---|---|
| 5,357,122 A * | 10/1994 | Okubora | .................. | G02B 6/43 |
| | | | | 257/432 |
| 6,618,149 B1 * | 9/2003 | Stirton | .................. | G01N 21/55 |
| | | | | 356/445 |
| 6,815,828 B1 * | 11/2004 | Coronel | .............. | H01L 25/0657 |
| | | | | 257/777 |
| 8,064,739 B2 | 11/2011 | Binkert et al. | | |

(Continued)

*Primary Examiner* — Mohsen Ahmadi
(74) *Attorney, Agent, or Firm* — Vierra Magen Marcus LLP

(57) ABSTRACT

A semiconductor device is disclosed including a stack of wafers having a densely configured 3D array of memory die. The memory die on each wafer may be arranged in clusters, with each cluster including an optical module providing an optical interconnection for the transfer of data to and from each cluster.

21 Claims, 10 Drawing Sheets

(56) References Cited

U.S. PATENT DOCUMENTS

| | | | | |
|---|---|---|---|---|
| 8,552,567 B2* | 10/2013 | England | ............... | H01L 21/561 |
| | | | | 257/777 |
| 9,397,757 B2 | 7/2016 | Hwang et al. | | |
| 9,899,442 B2* | 2/2018 | Katkar | ............. | H01L 21/76898 |
| 2009/0114927 A1* | 5/2009 | Cho | ....................... | G02B 6/43 |
| | | | | 257/84 |
| 2010/0067853 A1* | 3/2010 | Kuznia | .................. | G02B 6/43 |
| | | | | 385/88 |
| 2012/0098140 A1* | 4/2012 | Bartley | ................. | H01L 25/50 |
| | | | | 257/774 |
| 2014/0268980 A1* | 9/2014 | Kim | ...................... | G11C 5/063 |
| | | | | 365/64 |
| 2014/0363905 A1* | 12/2014 | McShane | ................ | G02B 6/30 |
| | | | | 438/17 |
| 2017/0097479 A1* | 4/2017 | Oomori | ............. | G02B 6/12004 |

* cited by examiner

SEMICONDUCTOR DEVICE INCLUDING OPTICALLY CONNECTED WAFER STACK

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Given the advantages of non-volatile memory devices, there is currently a push to use them as solid state drives (SSDs) in enterprise datacenters in the place of traditional hard disk drives (HDDs). In particular, because SSDs store data electronically and do not require the mechanical interface of an HDD, SSDs can read and write data more quickly than HDDs. Another feature of the electronic versus mechanical interface is that SSDs tend to last longer, and use less power for read/write operations.

The amount of data that is being generated and stored on a daily basis is growing rapidly, placing more and more demand on datacenters. With recent advances in SSD technology, SSD storage capacity has recently surpassed HDD storage capacity, and SSDs are scaling at a faster rate than HDDs. However, meeting data demands in enterprise datacenters remains a constant problem.

DETAILED DESCRIPTION

Figure 1:
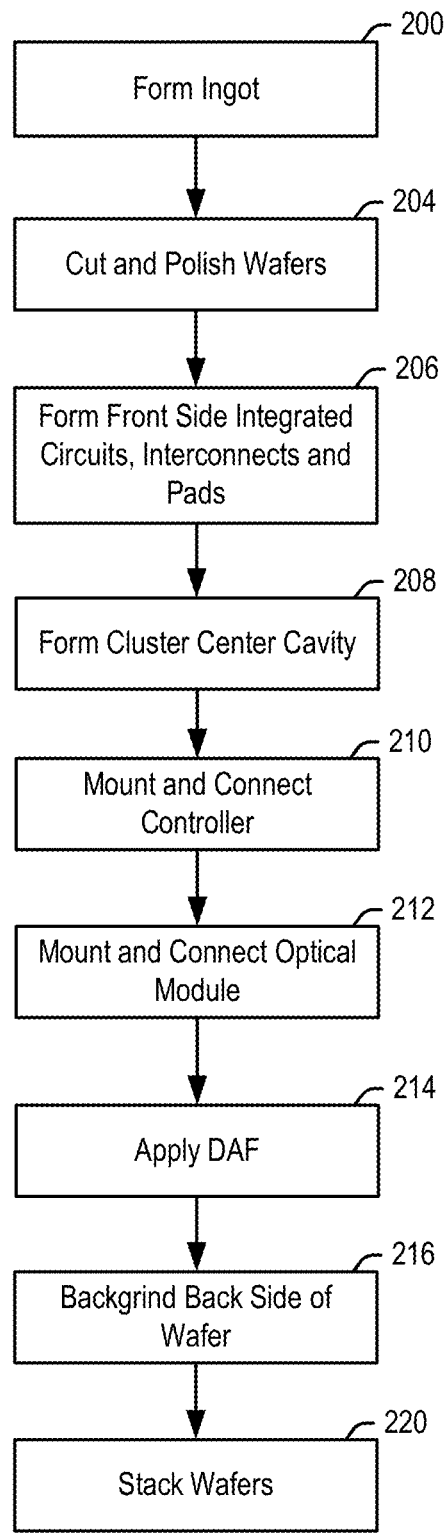
FIG. 1 is a flowchart for forming a semiconductor device according to embodiments of the present technology.

The present technology will now be described with reference to the figures, which in embodiments, relate to a semiconductor device comprising a stack of wafers having a densely configured 3D array of memory die. The memory die on each wafer may be arranged in clusters, with each cluster including an optical module providing an optical interconnection for the transfer of data to and from each cluster.

Wafers of the semiconductor device may be processed to include a number of semiconductor die arranged in clusters, and a cavity within each cluster. A controller die and an optical module may then be mounted within each cluster cavity, and electrically connected to the semiconductor die in the cluster. The processed wafers may then be thinned and stacked to form the completed semiconductor device.

The optical modules in each cluster on a wafer and across each wafer in the semiconductor device are used transfer light signals and/or power between select die in the semiconductor device and a host device, for example within a data center. A wavelength of the light signals may be selected, such as for example within the 800 to 1200 nm range, so that the light signals pass through the thin silicon wafers substantially without degradation.

The semiconductor device according to the present technology can have a large number of densely configured 3D memory die, to maximize the storage capacity of the semiconductor device. Moreover, the optical interface for the exchange of data operates at high speeds, while at the same time providing low power consumption and heat generation.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a defined dimension.

An embodiment of the present technology will now be explained with reference to the flowcharts of FIG. 1, and the views of FIGS. 2-16. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 (FIG. 7) opposite surface 102, to provide smooth surfaces. In step 206, the first major surface 102 may undergo various processing steps to divide the wafer 100 into respective semiconductor die 106 (FIGS. 2 and 3), and to form integrated circuits of the respective semiconductor die 106 on and/or in the first major surface 102. These various processing steps may include metallization steps depositing metal interconnect layers and vias within the wafer. These metal interconnect layers and vias may be provided for transferring signals/power to and from the integrated circuits within each semiconductor die, and to provide structural support to the integrated circuits.

Step 206 may further include the formation of one or more metal interconnect layers 108 and vias 109 (FIG. 6) within the silicon wafer at an elevation of the wafer 100 below semiconductor die 106. These metal interconnect layers may be formed into a predefined pattern using a variety of processes including for example etching and photolithography. The pattern of metal interconnects may be used to electrically connect a group, or cluster, of semiconductor die 106 to contact pads in a central cavity of the cluster as explained below.

Figure 2:
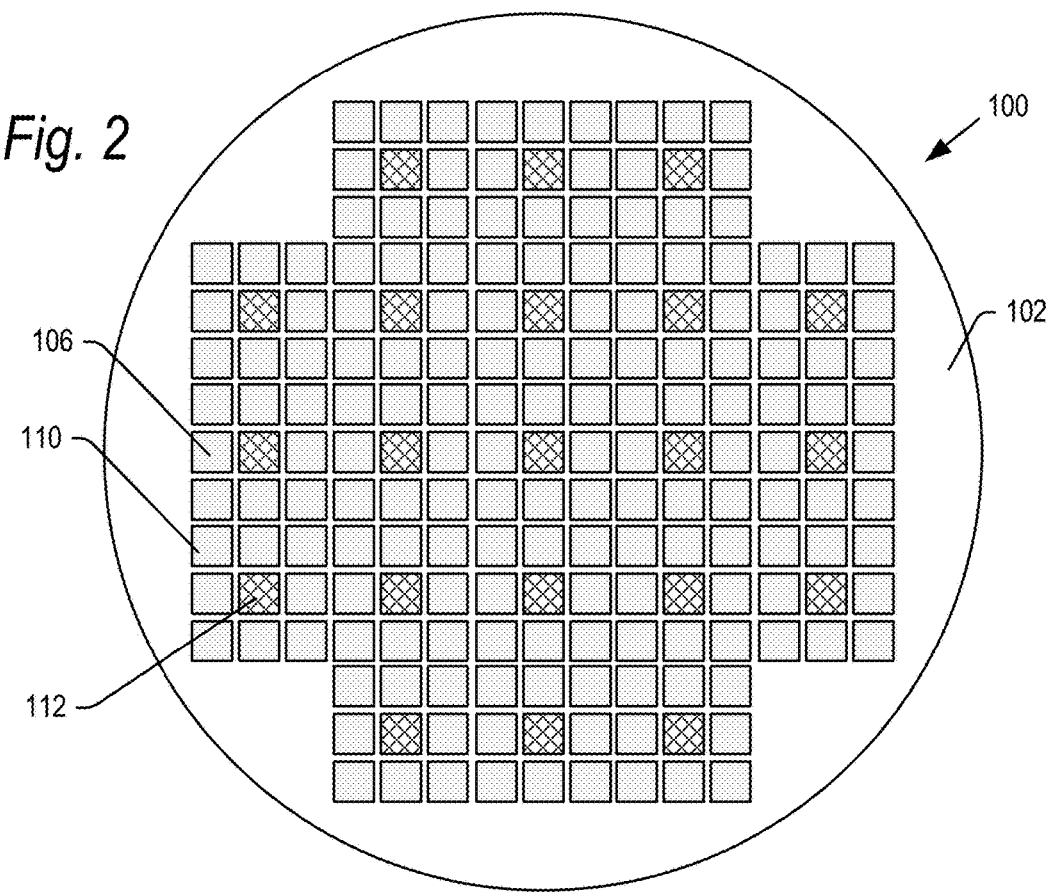
FIG. 2 is a front view of a semiconductor wafer showing a first major surface of the wafer.
Figure 3:
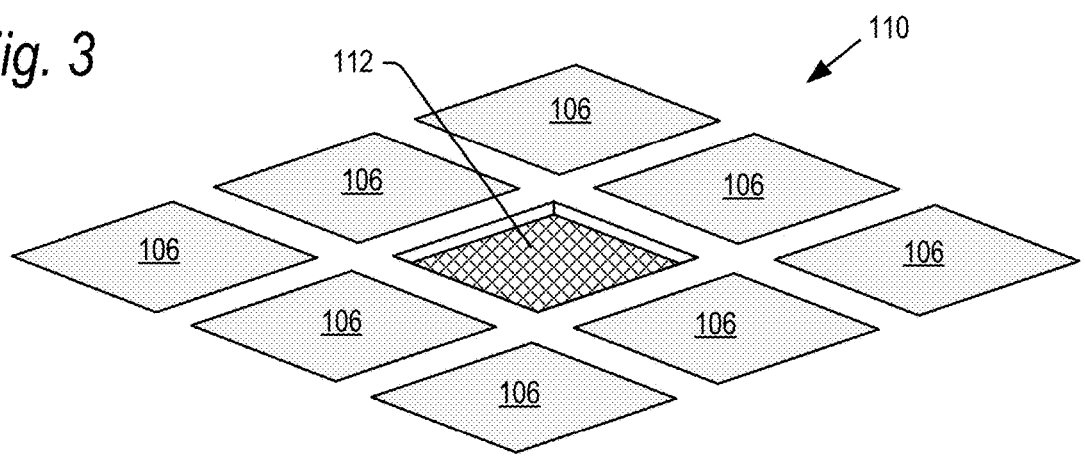
FIG. 3 is an enlarged perspective view of a memory cluster at a step in the fabrication of the semiconductor device according to embodiments of the present technology.

In embodiments, the semiconductor die 106 may for example be memory die such a NAND flash memory die, but other types of die 106 may be used. These other types of semiconductor die include but are not limited to controller die such as an ASIC, or RAM such as an SDRAM. The number of semiconductor die 106 shown on wafer 100 in FIG. 2 is for illustrative purposes, and wafer 100 may include more semiconductor die 106 than are shown in further embodiments. The semiconductor die 106 shown in FIG. 2 have a square or rectangular footprint, and are arranged in a number of parallel rows and columns. However, as explained below for example in FIG. 11, the semiconductor die 106 may be formed in other shapes and other patterns in further embodiments.

Figure 5:
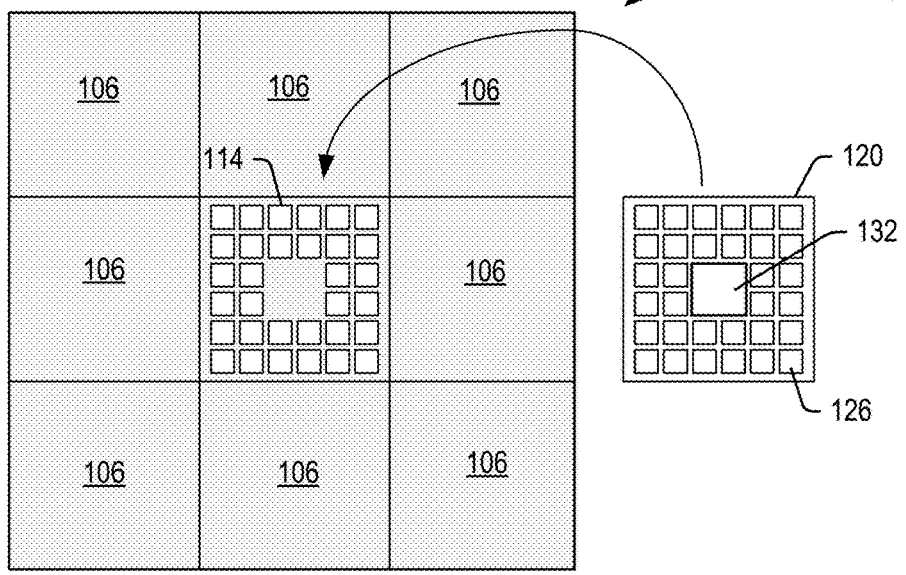
FIG. 5 is a top view of a first method of electrical connection of the controller die and optical module to the memory cluster on the wafer.

As noted above and shown in FIGS. 2 and 3, the semiconductor die 106 in wafer 100 may be divided into a number of repeating clusters 110, at times referred to herein as memory clusters 110. In the embodiment shown in FIGS. 2 and 3, where the semiconductor die 106 are arranged in rows and columns, a memory cluster 110 may comprise eight semiconductor die 106 all surrounding and directly adjacent to a center position (where no semiconductor die is formed). In step 208, this center position may be etched or otherwise removed to define a center cavity 112 in each cluster 110. Each semiconductor wafer 100 may be etched at cavity 112 down to a level to expose a number of contact pads 114 (one example of which is seen in FIG. 5) formed in or adjacent the one or more metal interconnect layers. In one embodiment, cavity 112 may be 5 mm long×5 mm wide by 1 mm deep. However, these dimensions are by way of example only and may vary, both proportionately and disproportionately with each other, in further embodiments.

In the example shown in FIG. 2, each semiconductor die 106 in a memory cluster 110 is directly adjacent to a center cavity 112, either along a row, column or diagonal. It is conceivable that one or more semiconductor die 106 in a cluster 110 not be directly adjacent to a central cavity in further embodiments. In such further embodiments, a given semiconductor die 106 may be spaced apart from the central cavity by one or more other semiconductor die along a row, column or diagonal. As explained below for example with respect to FIG. 11, semiconductor die 106 may be arranged in patterns other than rows and columns, where at least most of the semiconductor die 106 in a memory cluster 110 lie directly adjacent a central cavity 112.

Figure 4:
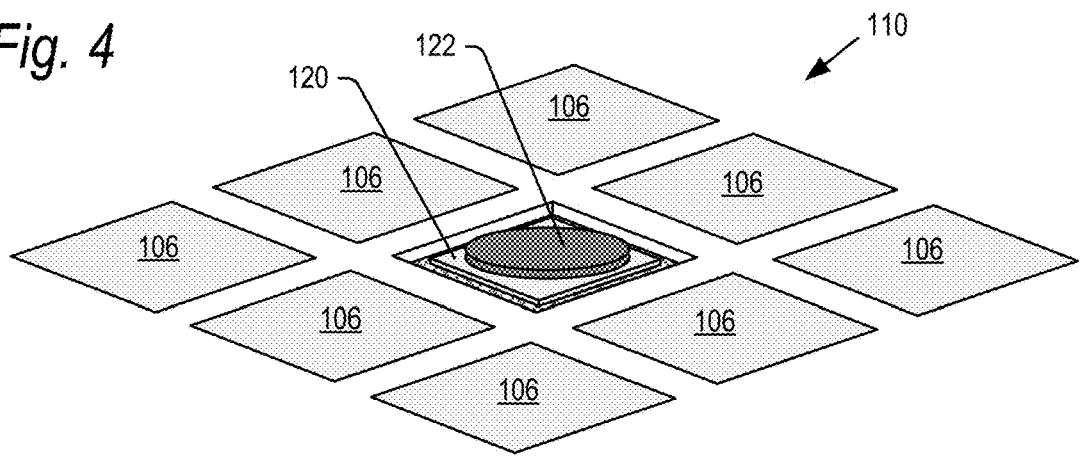
FIG. 4 is an enlarged perspective view of a memory cluster at a further step in the fabrication of the semiconductor device according to embodiments of the present technology.

In steps 210 and 212, a controller 120 and an optical module 122 may be mounted within each central cavity 112 on wafer 100 as shown in FIG. 4, and electrically coupled to the contact pads 114 at the base of the cavity 112. The controller 120 may for example be an ASIC controlling the transfer of data to and from the semiconductor die 106 within its associated cluster 110. The optical module 122 may transfer input/output (I/O) requests and other commands and data between the controller die 120 and a host device as explained below. Further details of the optical module 122 are provided below.

Figure 6:
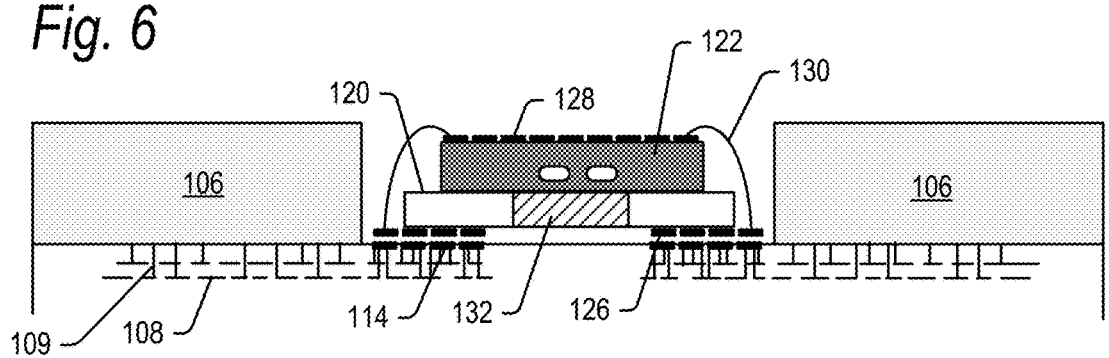
FIG. 6 is a cross-sectional edge view of a second method of electrical connection of the controller die and optical module to the memory cluster on the wafer.

The controller 120 and the optical module 122 may be electrically coupled to contact pads 114 at the base of cavity 112 by any of a variety of electrical coupling schemes. FIGS. 5 and 6 show two examples of such electrical coupling schemes. In FIG. 5, the controller die 120 may include a pattern of die bond pads 126 matching a pattern of the contact pads 114 in cavity 112. The particular pattern of contact pads 114 and die bond pads 126 is shown by way of example only, and may vary widely in further embodiments. Solder balls may be provided on die bond pads 126 so that the pads 126 of the controller 120 may be bonded to the contact pads 114 in a known flip-chip reflow bonding process.

Thereafter, the optical module 122 may be physically mounted on an upper surface of controller 120, and electrically coupled to the controller 120 and/or contact pads 114 on wafer 100. In one embodiment, the optical module 122 may include contact pads 128 (FIG. 7) on a bottom surface in contact with a top surface of controller 120. The controller 120 may include TSV (through silicon vias) extending between a top and bottom surface of the controller, enabling electrical connection of the optical module 122 to the controller 120 and/or contact pads 114 on wafer 100. TSW (through silicon wires) may be used instead of TSV in further embodiments to electrically couple the optical module 122 to controller 120 and/or contact pads 114.

FIG. 6 shows a further embodiment, where controller 120 may be flip-chip bonded to some of the contact pads 114 as described above, leaving other contact pads 114 exposed. Thereafter, the optical module 122 mounted on top of the controller 120, and wire bonded to the exposed contact pads 114, using for example bold wire bonds 130. It is understood that the controller 120 and optical module 122 may be electrically coupled to each other and the contact pads 114 of wafer 100 by other electrical coupling schemes in further embodiments. In one such further embodiment, both the controller 120 and optical module 122 may include bond pads and solder balls on a surface, and both may be flip-chip bonded to contact pads 114 at the base of the cavity 112.

In embodiments where the optical module 120 is mounted on the controller 120, controller 120 may include an opening 132 which is aligned beneath a transmitter and receiver of the optical module 122 explained below. The opening allows light to travel to and from the optical module 122, through the controller 120, without being interrupted or degraded by circuitry otherwise formed within controller 120. In an alternative embodiment, the controller may not have an opening 132, but instead would have a keep-out area with no circuitry in the area otherwise occupied by opening 132. Contact pads 114 on wafer 100 may similarly have an open area corresponding to the keep out area or opening 132 on controller 120.

Figure 7:
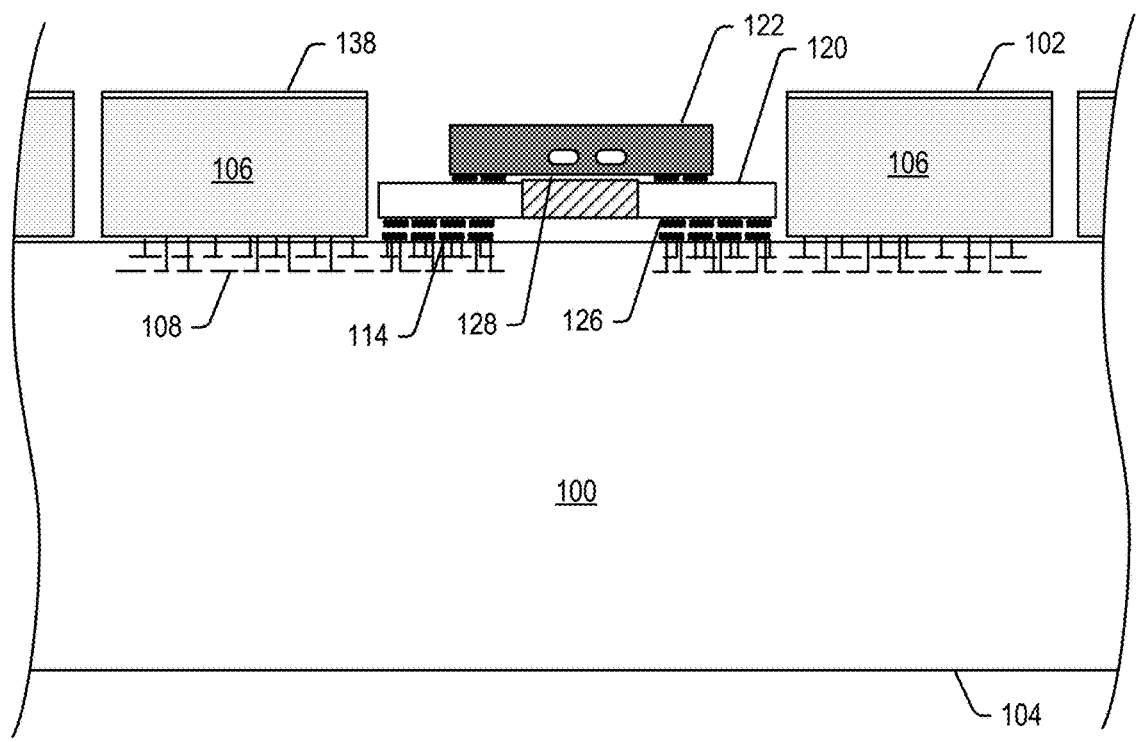
FIG. 7 is a cross-sectional edge view of a memory cluster of FIG. 4 according to embodiments of the present technology.

Before or after the controller 120 and optical module 122 have been mounted to the contacts 114 of wafer 100, a layer of DAF (die attach film) 138 may be applied to upper surfaces of semiconductor die 106 in step 214 as shown in FIG. 7. The DAF layer 138 may be applied to the semiconductor die 106 while leaving the cavity 112 open.

Figure 8:
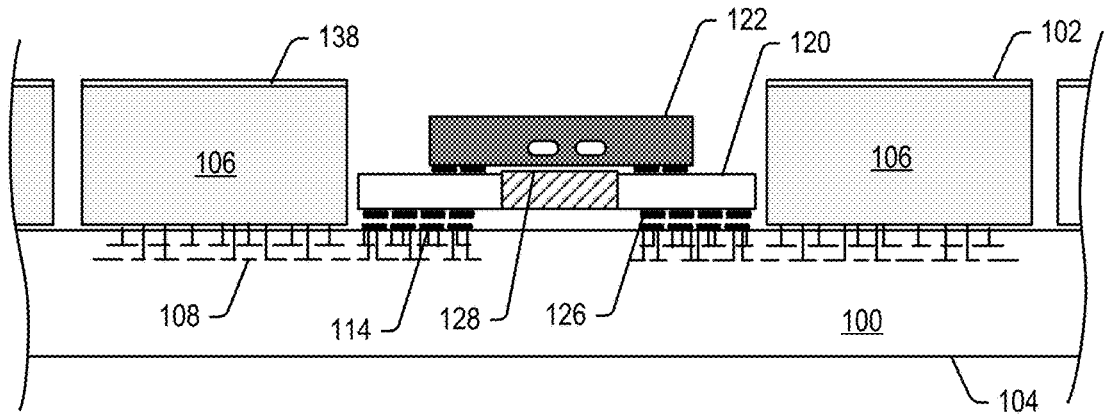
FIG. 8 is a cross-sectional edge view of a memory cluster at another step in the fabrication of the semiconductor device according to embodiments of the present technology.

FIG. 7 shows a full-depth cross-sectional view of a single memory cluster 110 of wafer 100 after DAF layer 138 is applied and after the controller 120 and optical module 122 have been mounted to the contacts 114 of wafer 100. In step 216, the wafer may be thinned in a back-grind process. In particular, the wafer 100 may be inverted and transferred to a chuck so that the DAF layer 138 on major surface 102 is supported on the chuck. One or more grinding wheels may then be applied against the inactive surface 104 to thin the inactive surface 104. FIG. 8 shows a full-depth cross-sectional view of a single memory cluster 110 of wafer 100 after back-grind step 216.

Figure 9:
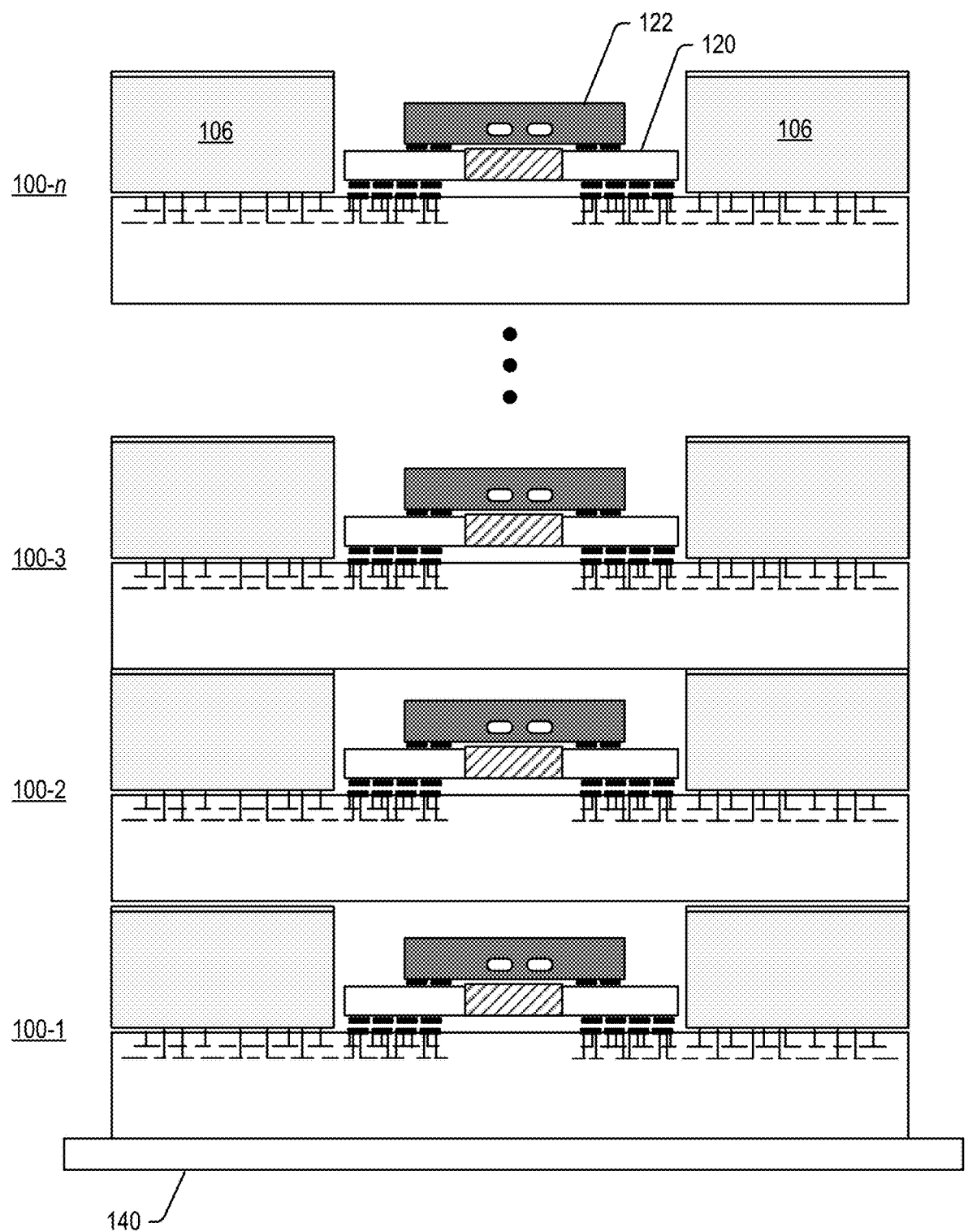
FIG. 9 is a cross-sectional edge view of at a further step in the fabrication of the semiconductor device according to embodiments of the present technology showing a number of memory clusters stacked on top of each other on wafers.

The above steps 200-216 have been described as being performed on a single wafer 100. However, in accordance with aspects of the present technology, a number of wafers 100 may be processed according to steps 200-216, and then stacked on top of each other in step 220. Each of these wafers would be processed using the same wafer layout map so that each of the semiconductor die 106 and memory clusters 110 would be identical from wafer to wafer. FIG. 9 shows a cross sectional view of a single wafer cluster from a number of wafers, n, stacked on each other. After the back-grind step, the wafers may be inverted and stacked while supported on a support table 140. In stacking the wafers, the angular orientation of each wafer is kept the same, so that the die 106 and memory clusters 110 align over each other from wafer to wafer when they are stacked.

Figure 10:
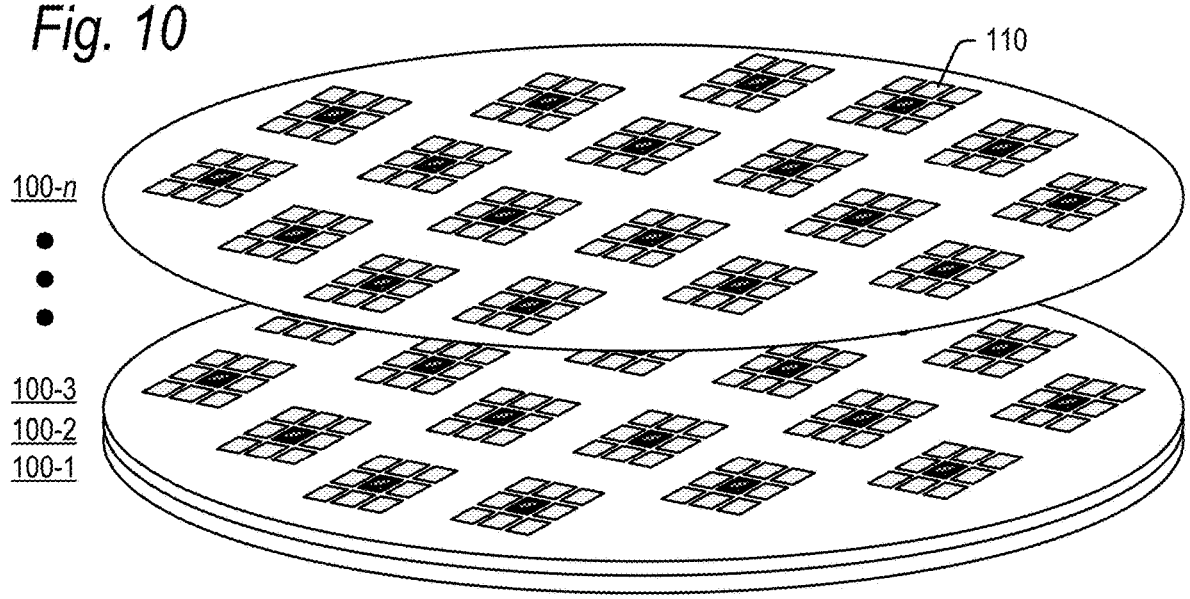
FIG. 10 is a perspective edge view of a semiconductor device including a number of stacked wafers according to embodiments of the present technology.

FIG. 10 shows a perspective view of entire wafers 100 stacked on top of each other. The pattern of memory clusters 110 in wafers 100 in FIG. 10 is for illustration purposes and may vary in further embodiments. The wafers 100 shown in FIG. 10 may together comprise a semiconductor device 150 in accordance with the present technology. FIGS. 9 and 10 show wafers 100-1, 100-2, 100-3, . . . , 100-n stacked together to form the semiconductor device 150. In embodiments, there may be 4, 8, 16, 32 or 64 wafers 100 stacked on top of each other in the device 150. However, there may be other numbers of wafers in the stack in further embodiments, including any number of wafers between 1 and 64. In further embodiments, there may be greater than 64 stacked wafers in semiconductor device 150. The wafers are held onto each other by the DAF layer 138 on the upper surface of each die. Once all of the wafers are stacked, the semiconductor device 150 may be heated to cure the DAF layers 138 and to secure the wafers 100 within the semiconductor device 150. The completed semiconductor device 150 may then be removed from the support table 140.

Figure 11:
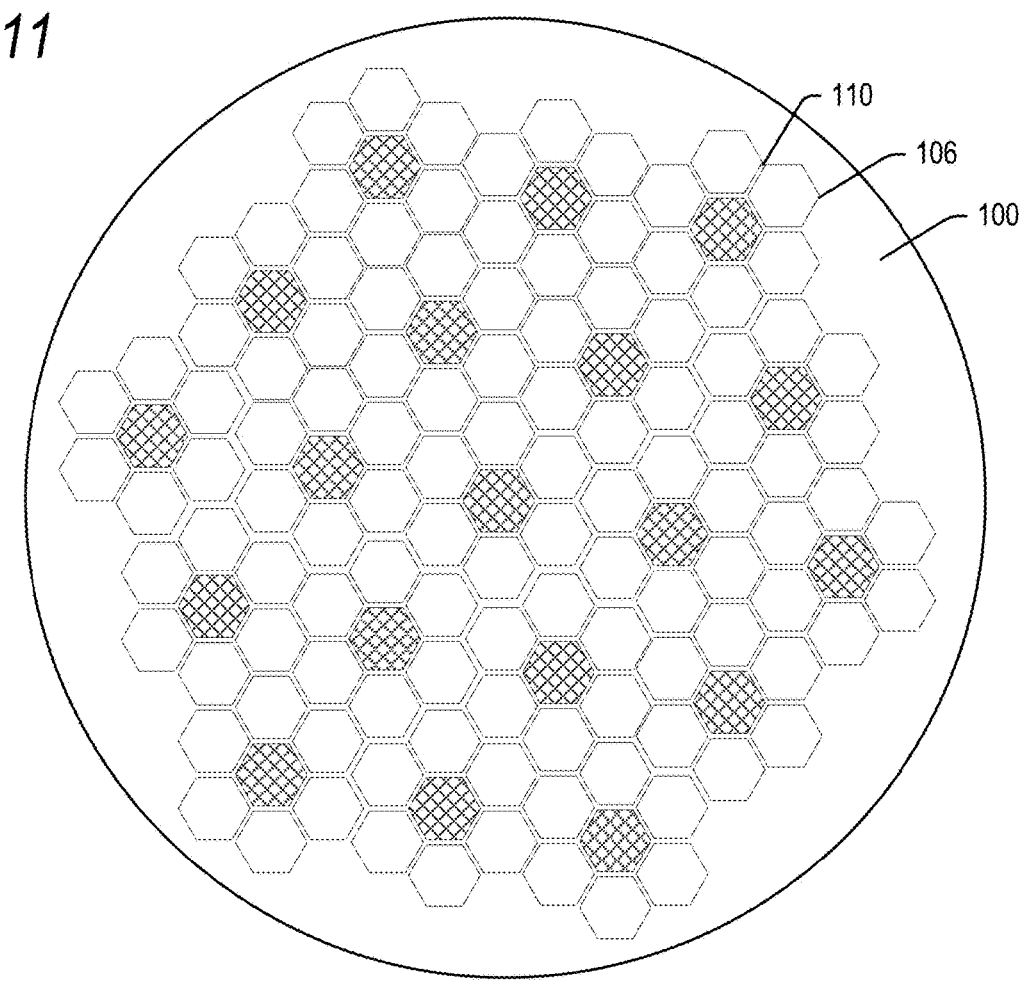
FIG. 11 is a top view of clusters of semiconductor die formed on a wafer according to an alternative embodiment of the present technology.

As noted, the shape of the semiconductor die 106, and the configuration of the die 106 and memory clusters 110, may vary in different embodiments. FIG. 11 shows one further embodiment where the shape of semiconductor die 106 and memory clusters 110 are configured as hexagons. This may provide a slightly higher density of semiconductor die 106 on the wafer 100 as compared to semiconductor die 106 arranged in rows and columns. Other configurations and layouts of semiconductor die 106 and memory clusters 110 are contemplated.

In the embodiment shown in FIG. 11, each die 106 may be directly adjacent to a center cavity 112 in a memory cluster 110. However, in certain arrangements of die 106 and clusters 110, one or more die may be spaced from a cavity 112 by one or more other die. These spaced positions may be processed into semiconductor die 106 and connected to the nearest center cavity 112 by metal interconnects 108 as described above. Alternatively, these spaced positions may be left blank, with no semiconductor die 106 being formed there.

Figure 12:
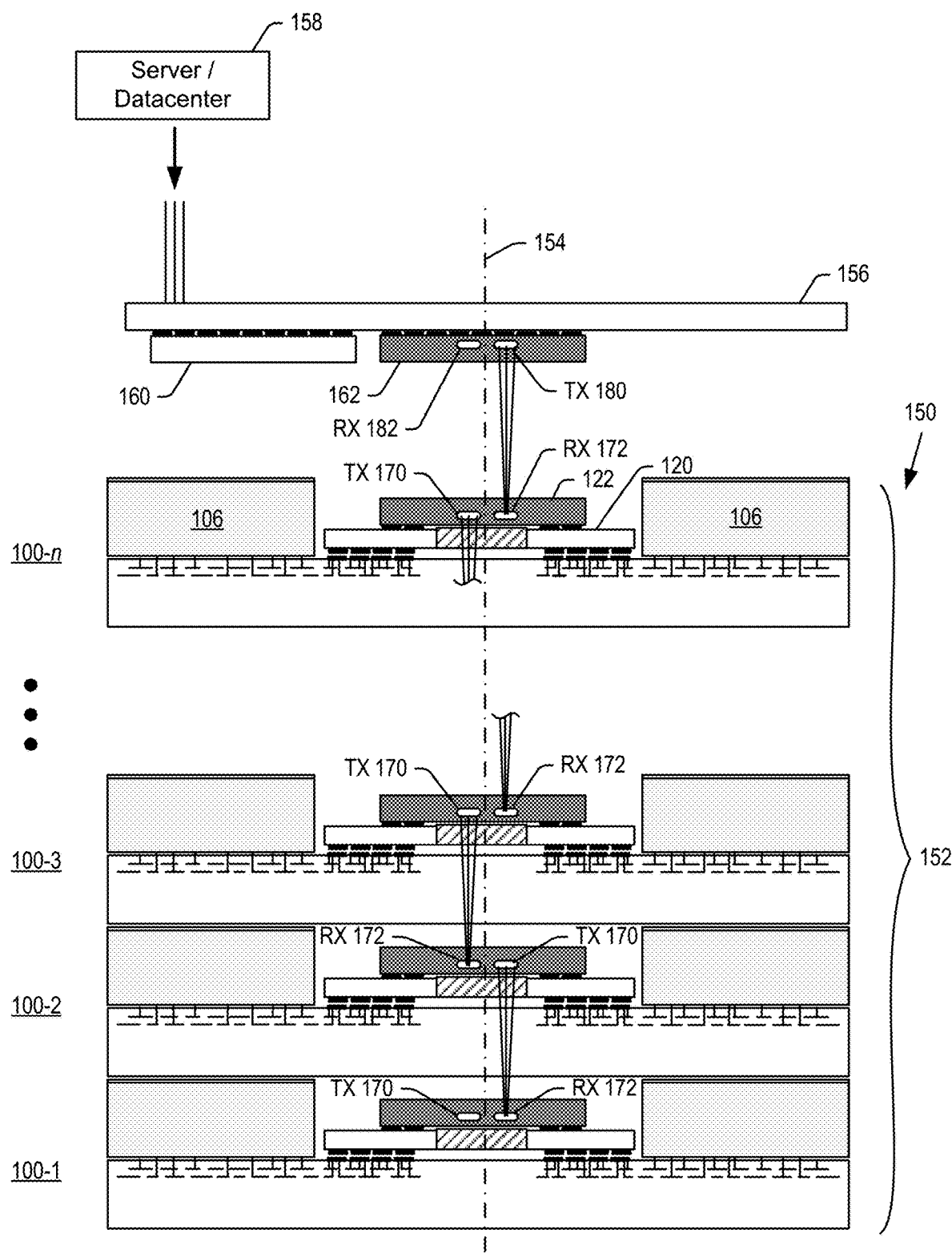
FIGS. 12 and 13 are edge views illustrating communication between a host device and a semiconductor device according to embodiments of the present technology.
Figure 13:
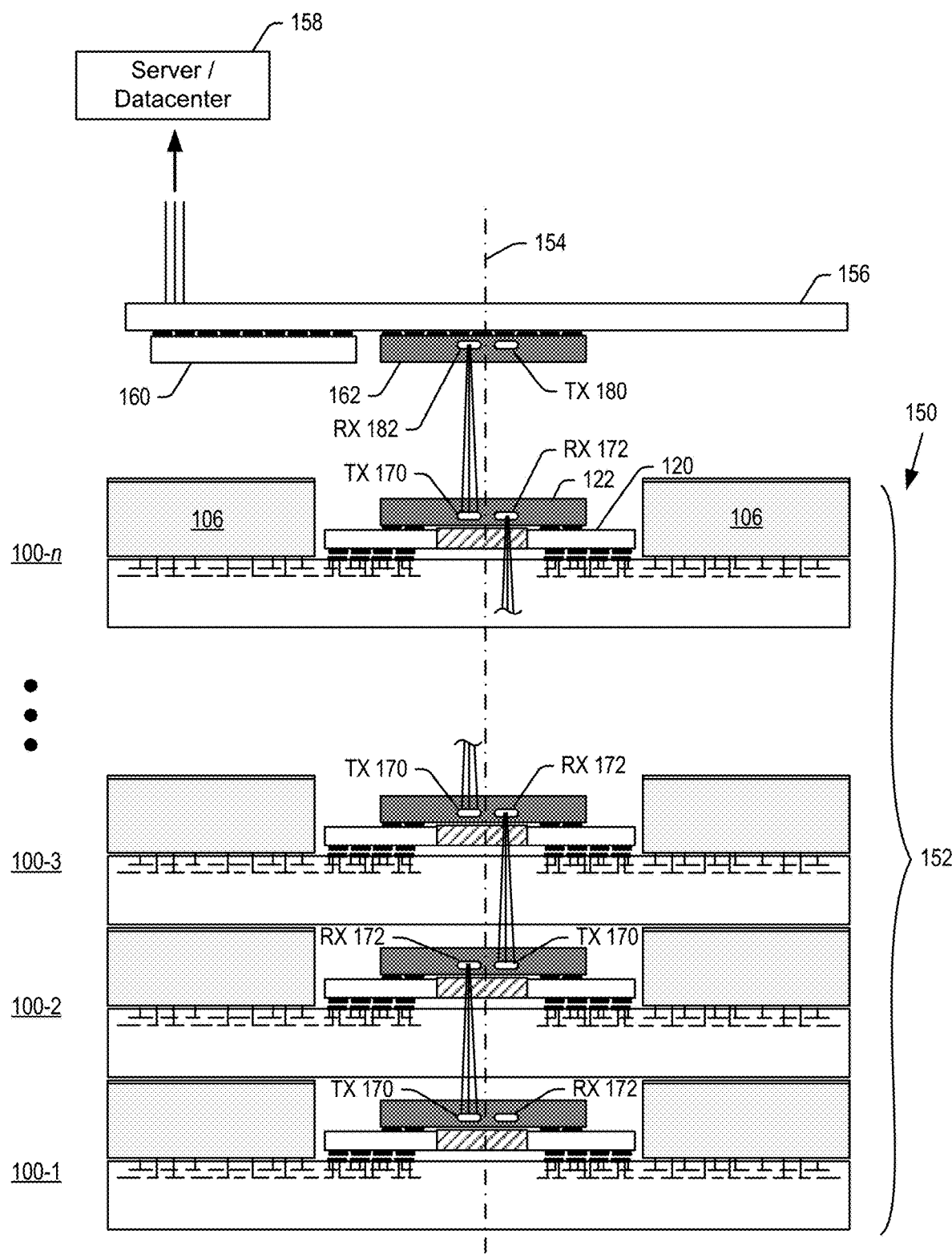

FIGS. 12 and 13 illustrate an example of the operation of a semiconductor device 150 in a datacenter. In order to allow data transfer to/from a particular semiconductor die 106 in semiconductor device 150, memory clusters 110 which are aligned with each other through the wafer stack may be organized into a 3D memory cluster array 152. "Aligned" as used here refers to alignment of each 3D memory cluster array 152 along an axis 154, perpendicular to the major surfaces 102 of the wafers 100 in the semiconductor device 150. Each 3D memory cluster array 152 in the semiconductor device 150 may be assigned a unique stored identifier, and each semiconductor die 106 in each 3D memory cluster array 152 may be assigned a unique stored identifier. This unique die identifier may be specified for example by wafer number and 3D memory cluster array in the wafer stack, and relation of the die to the center cavity 112. It is understood that each semiconductor die 106 in the semiconductor device 150 may be uniquely identified by other schemes in further embodiments.

Each semiconductor device 150 may be operatively coupled to a printed circuit board (PCB) 156 configured to transfer data between a semiconductor device 150 and a server 158 of the datacenter. While the large storage capacity of semiconductor device 150 makes it well-suited for a SSD in a datacenter, the semiconductor device may be used for data transfer with host computing devices in a wide variety of other environments. The PCB 156 may include one or more controllers 160, and a number of optical modules 162 for transferring data to and from the optical modules 122 in device 150. Each optical module 162 on PCB 156 may be aligned along the axis 164 with an optical module 132 in a 3D memory cluster array 152. Alternatively, there may be fewer optical modules 162 on PCB 156 than there are optical modules 122 on a wafer 100 (including as few as a single optical module 162). In such embodiments, mirrors on PCB 156 may direct the light signals from the multiple optical modules 132 in semiconductor device 150 to the one or more optical modules 162 on the PCB 156.

In operation, the controller 160 on PCB 156 identifies a particular semiconductor die 106, and storage location on that die 106, to access for a read/write operation. For a read operation for example, an enable signal and read request is sent to a selected die and storage location on that die via the optical module 162, and optical modules 122 in the identified 3D memory storage cluster 152. In particular, as shown in FIG. 12, the signal and request are optically encoded in the one or more optical modules 162 on PCB 156, and sent from transmitter 180 to the appropriate 3D memory storage cluster 152 and wafer 100. The signal and request are then transmitted down the 3D memory cluster array 152, from the transmitter (TX) 170 of optical modules 122 to the receiver (RX) 172 of the next adjacent optical modules 122 until the selected die 106 is accessed. The requested data is then returned from the die storage location via the transmitters 170 and receivers 172 of the optical modules 122 to the receiver 182 in the PCB optical module 162 as shown in FIG. 13.

Figure 14:
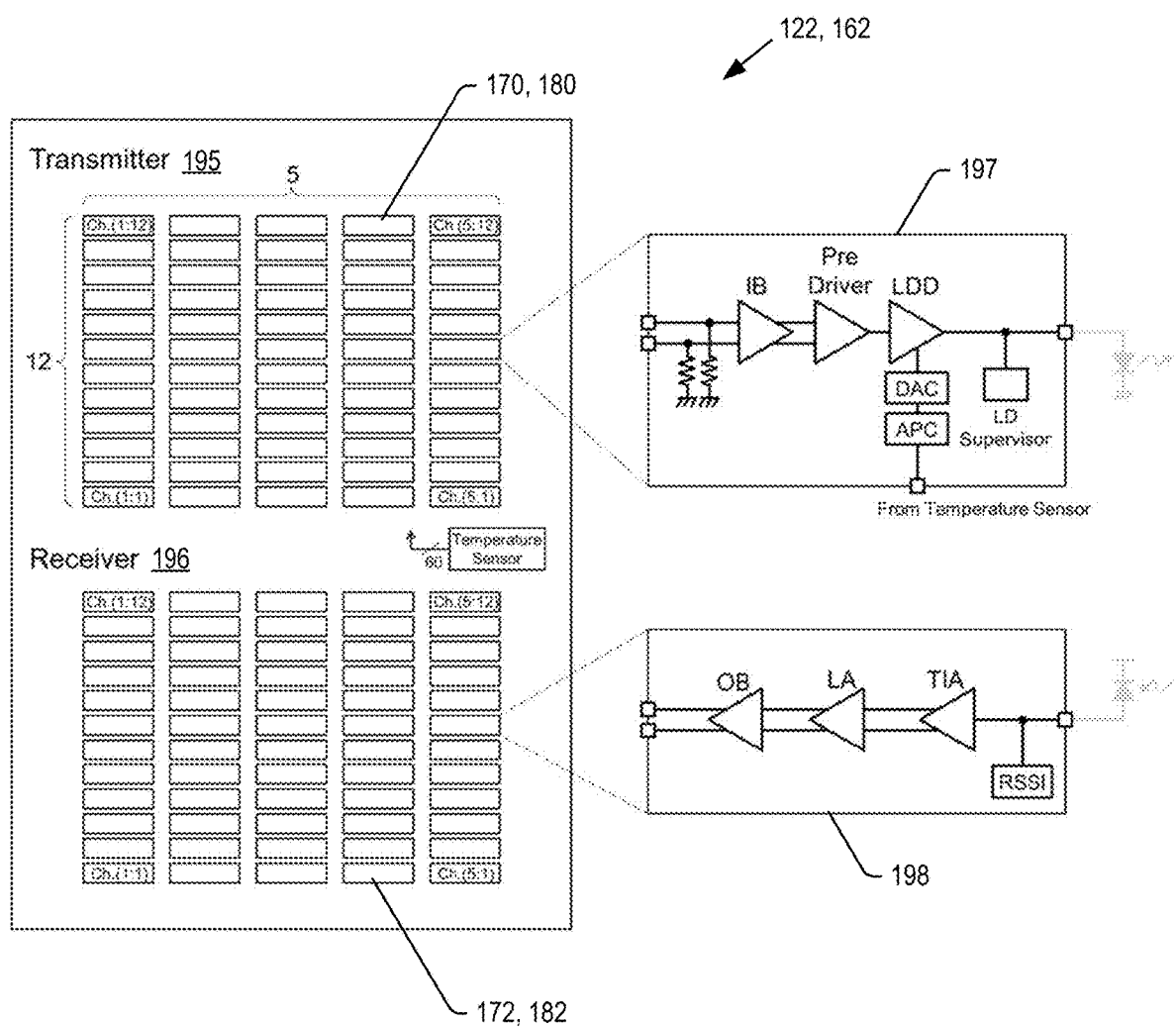
FIG. 14 is a block diagram of an example of an optical module for use with embodiments of the present technology.

In FIGS. 6-9, 12 and 13, the optical modules 122, 162 are shown schematically. However, in embodiments, the optical modules 122, 162 may include an I/O array consisting of a large number of TX/RX lanes. One such example is shown in FIG. 14. The optical module 122, 162 may be a known optical module, described for example in the publication entitled "Compact and High-Density Opto-electronic Transceiver Module for Chip-to-Chip Optical Interconnects," to Mori et al., and/or in the publication entitled "A 12×5 Two-Dimensional Optical I/O Array for 600 Gb/s Chip-to-Chip Interconnect in 65 nm CMOS," to Morita et al, from the 2014 IEEE International Solid-State Circuits Conference, Session 8. However, in general, the optical modules 122, 162 may each include a transmitter array 195 comprising transmitters 170, 180, and a receiver array 196 comprising receivers 172, 182. The arrays 195, 196 shown in FIG. 14 comprise 60 transmitters/receivers for a 60 channel TX/RX optical link, but there may be more or less in further embodiments. The transmitters and receivers of the arrays 195, 196 may further include driver circuits 197, 198, respectively.

Although not shown, optical module 122, 162 may further include O/E (optoelectronic) devices, for example using vertical cavity surface emitting laser (VCSEL) for emitting light and PIN PDs (photodiodes) for receiving light. The O/E devices may be mounted or integrated on the surfaces of the integrated circuits of the TX/RX arrays 195, 196. The laser light may be directed using microelectromechanical (EMs) mirrors. As noted, other types of optical modules may be used in the present technology to transmit signals to and from the semiconductor device 150. In embodiments, the optical modules may transmit light for example within the 800 nm to 1200 nm range, so that the light signals pass through the thin silicon wafers and controllers substantially without degradation. Other wavelengths are contemplated.

Figure 15:
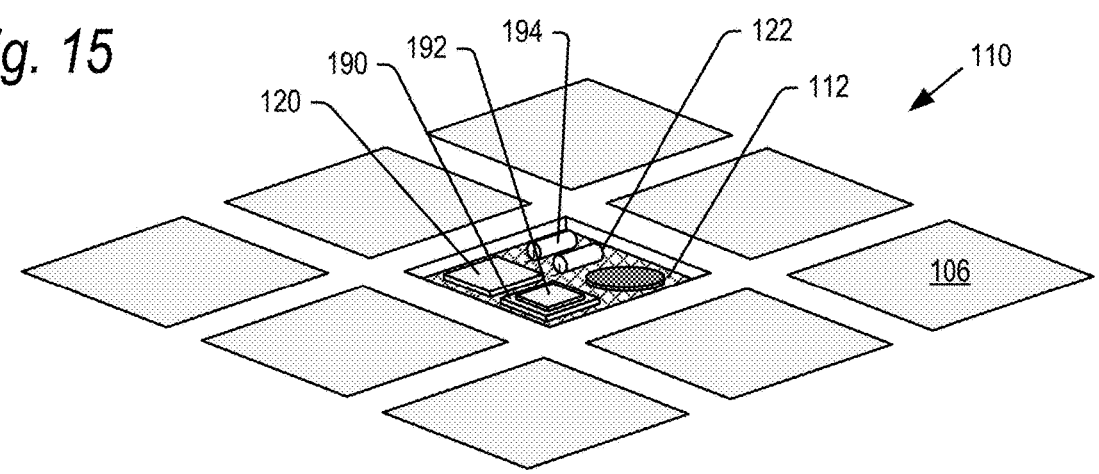
FIGS. 15 and 16 are perspective and cross-sectional edge views, respectively, of a semiconductor device according to a further embodiment of the present technology.
Figure 16:
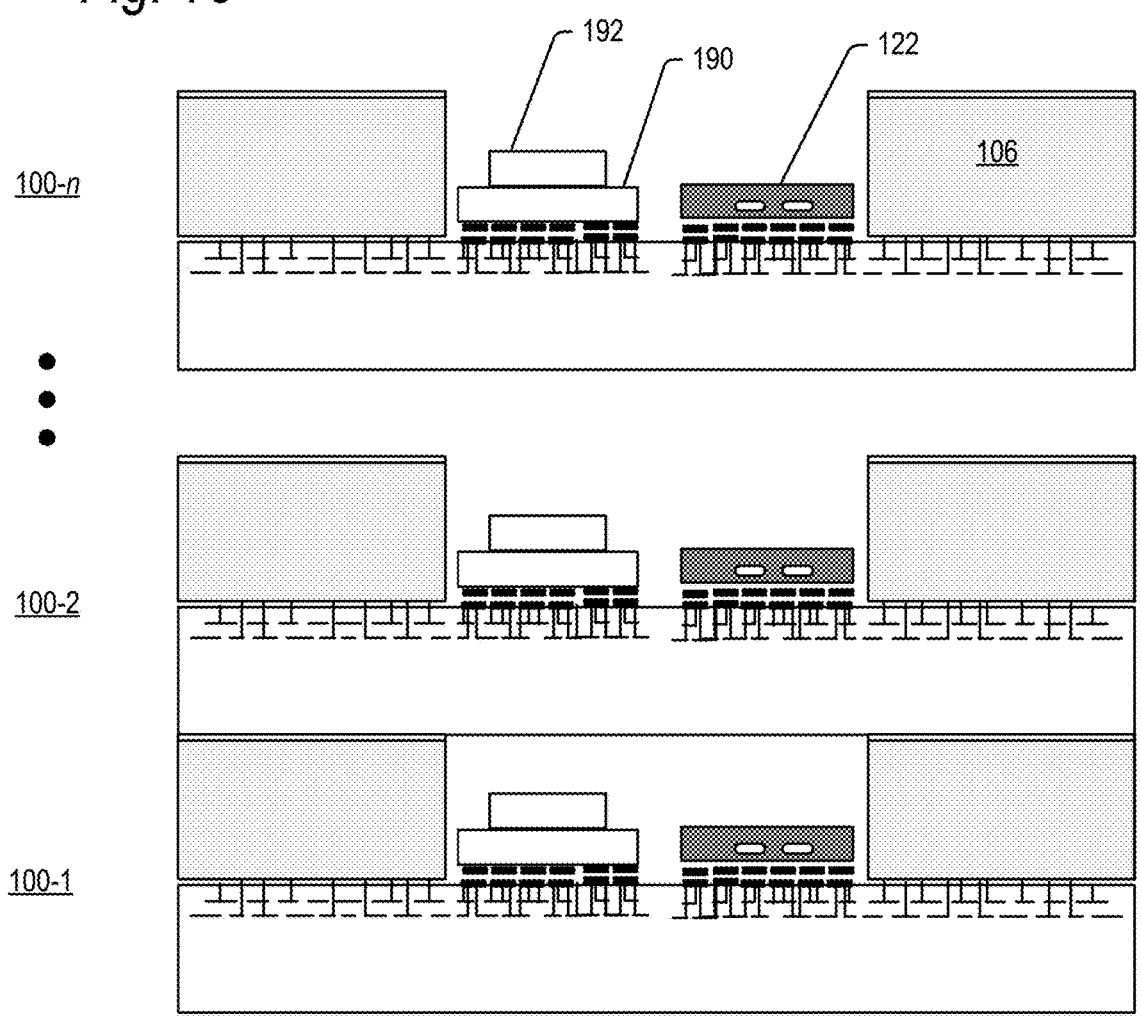

In the embodiments described above, a controller 120 and optical module 122 are provided within the cavity 112 in each memory cluster 110. However, it is understood that other components may be provided within the cavities 112 instead of or in addition to the controller 120 and/or optical module 122 in further embodiments. FIGS. 15 and 16 are perspective and cross-sectional views, respectively, of a further embodiment of the present technology where cavity 112 includes such additional components. The cavity 112 includes controller 120 and optical module 122 as described above. The cavity 112 further includes additional electronic components 190, 192 and/or passive components 194.

The additional electronic components 190, 192 may be semiconductor die or other integrated circuit components. While two such additional electronic components 190, 192 are shown, there may a single additional electronic component, or more than two additional electronic components in further embodiments. Passive components 194 may include capacitors, resistors, inductors or other components that do now require a voltage to operate. While two passive components are shown in cavity 112, there may be one or more than two in further embodiments. FIG. 16 shows cavities 112 from a number of stacked wafers 100 including the additional electronic components 190, 192 and the passives components 194.

In embodiments described above, the semiconductor device 150 has a footprint in the shape of the circular diameter of the wafer 100, and a depth of the thicknesses of the wafers including the DAF layers 138. In further embodiments, a wafer need not be circular, but can be square, rectangular, oval, oblong, polygon or other shapes in further embodiments.

Additionally, the wafers 100 in the stack may be diced into wafer sections of different shapes before the sections are stacked on each other to form the semiconductor device as described above. Thus, the semiconductor device 150 may comprise sections of a wafer having a footprint which is square, rectangular, oval, oblong, polygon or other shapes in further embodiments.

As used herein, a wafer may refer to an entire (undiced) wafer or a portion of a wafer after dicing. Thus, for example, a semiconductor device 150 may be formed from diced wafer sections which have been cut and then stacked. Such a semiconductor device may be referred to herein as a semiconductor device formed of, or comprising, a plurality of wafers. Such a device may include the cavities, optical modules and controllers as described above.

Embodiments of the present technology provide a semiconductor device having a densely packed configuration of NAND flash memory to provide a large data storage capacity in a small overall form factor. Such a semiconductor device could be used in any of a variety of computing environments, but may advantageously be used within a datacenter. Additionally, transmitting data to and from the semiconductor device using high-bandwidth laser light signals reduces the heat generated and power consumed in such a semiconductor device as compared to devices using bond wires and metal traces to transmit data.

In summary, the present technology relates to a semiconductor device, comprising: one or more undiced semiconductor wafers processed to include a plurality of semiconductor die; and a plurality of optical modules configured to transfer data to and from the plurality of semiconductor die on the one or more wafers using light signals.

In another example, the present technology relates to a semiconductor device, comprising: a plurality of stacked wafers, each wafer comprising: a plurality of semiconductor die processed into the wafer; a plurality of cavities; and a plurality of optical modules mounted in the plurality of cavities and configured to transfer data to and from the plurality of semiconductor die using light signals.

In a further example, the present technology relates to a semiconductor device, comprising: a plurality of stacked wafers; a plurality of semiconductor die processed into the plurality of stacked wafers; a plurality of cavities in the plurality of stacked wafers; and a plurality of optical modules in the plurality of cavities of different wafers, the plurality of optical modules configured to transfer light signals to each other through the plurality of stacked wafers.

In a further example, the present technology relates to a semiconductor device, comprising: a plurality of stacked wafers, each wafer comprising: a plurality of semiconductor die processed in clusters into the wafer; a plurality of cavities, one cavity in each cluster on the wafer; a plurality of optical modules, one optical module mounted in each of the plurality of cavities, and configured to transfer data to and from the plurality of semiconductor die using light signals; and a plurality of controller die, one controller die mounted in each of the plurality of cavities, and configured to control the transfer of data to and from the plurality of semiconductor die.

In another example, the present technology relates to a semiconductor device, comprising: a plurality of stacked wafers, each wafer comprising: a plurality of semiconductor die processed into the wafer; optical signal transmission means for transmitting signals along an axis perpendicular to a surface of the wafers; and controller means for controlling the transfer of data to and from the plurality of semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
one or more semiconductor wafers, each semiconductor wafer of the one or more semiconductor wafers comprising:
a plurality of discrete semiconductor die;
a plurality of cavities formed partially through each semiconductor wafer, separate from, and at least partially surrounded by, the plurality of discrete semiconductor die;
a plurality of optical modules mounted in the plurality of cavities, the plurality of optical modules configured to transfer data to and from the plurality of discrete semiconductor die on the one or more semiconductor wafers using light signals; and
a plurality of controller die are mounted within the plurality of cavities formed in a surface of the one or more semiconductor wafers for controlling the transfer data to and from the plurality of semiconductor die
wherein the plurality of discrete semiconductor die are arranged in a plurality of clusters on each of the one or more semiconductor wafers.

2. The semiconductor device of claim 1, wherein the one or more semiconductor wafers comprise a plurality of stacked semiconductor wafers.

3. The semiconductor device of claim 2, wherein a group of the plurality of optical modules are provided in successive layers of the plurality of stacked semiconductor wafers and axially aligned with each other along an axis perpendicular to a surface of the stacked semiconductor wafers, the group of optical modules transmitting light to each other along the axis through the plurality of stacked semiconductor wafers.

4. The semiconductor device of claim 3, wherein the plurality of optical modules transmit the light signals within a wavelength range of 800 nm to 1200 nm.

5. The semiconductor device of claim 1, wherein the plurality of optical modules comprise one optical module in each of the plurality of clusters.

6. The semiconductor device of claim 5, wherein semiconductor die in a cluster are each directly adjacent to a position of the optical module in the cluster.

7. The semiconductor device of claim 1, wherein the plurality of semiconductor die comprise flash memory die.

8. A semiconductor device, comprising:
a plurality of stacked semiconductor wafers, each semiconductor wafer comprising:
a plurality of semiconductor die processed in repeating clusters into the semiconductor wafer;
a plurality of cavities separate from, and at least partially surrounded by, the repeating clusters of semiconductor die; and
a plurality of optical modules mounted in the plurality of cavities and configured to transfer data to and from the plurality of semiconductor die using light signals;
a plurality of controller die mounted in the plurality of cavities and configured to control the transfer of data to and from the plurality of semiconductor die, wherein the plurality of controller die are mounted to a base of the plurality of cavities, and the plurality of optical modules are mounted on the controller die.

9. The semiconductor device of claim 8, wherein the plurality of optical modules transmit the light signals through the plurality of semiconductor wafers.

10. The semiconductor device of claim 8, wherein the plurality of optical modules comprise two or more optical modules on two or more of the plurality of stacked semiconductor wafers, the two or more optical modules being aligned along an axis perpendicular to a surface of the plurality of semiconductor wafers, the two or more optical modules transmitting the light signals through the plurality of semiconductor wafers.

11. The semiconductor device of claim 8, wherein the plurality of controller die and optical modules comprise two or more controller die and two or more optical modules in cavities on the plurality of stacked semiconductor wafers, the two or more controller die and the two or more optical modules being aligned along an axis perpendicular to a surface of the plurality of semiconductor wafers, the two or more optical modules transmitting the light signals through the two or more controller die and the plurality of stacked semiconductor wafers.

12. The semiconductor device of claim 8, wherein the plurality of semiconductor die are arranged in a plurality of clusters on each semiconductor wafer of the plurality of stacked semiconductor wafers.

13. The semiconductor device of claim 12, wherein the plurality of optical modules comprise one optical module in a cavity in each of the plurality of clusters.

14. A semiconductor device, comprising:
a plurality of stacked semiconductor wafers;
a plurality of semiconductor die processed into the plurality of stacked semiconductor wafers;
a plurality of cavities in the plurality of stacked semiconductor wafers, the plurality of cavities comprising a surface having pattern of electrical contacts; and
a plurality of optical modules mounted in the plurality of cavities of different semiconductor wafers and electrically coupled to the pattern of electrical contacts, the plurality of optical modules configured to transfer light signals to each other through the plurality of stacked semiconductor wafers;
a plurality of controller die, one of the plurality of the controller die mounted in each of the plurality of cavities, and configured to control the transfer of data to and from the plurality of semiconductor die.

15. The semiconductor device of claim 14, wherein the plurality of optical modules are axially aligned with each other along an axis perpendicular to a surface of the plurality of stacked semiconductor wafers.

16. The semiconductor device of claim 14, wherein the plurality of optical modules are configured to transfer light signals to each other through the plurality of stacked wafers and through the plurality of controller die.

17. A semiconductor device, comprising:
a plurality of stacked semiconductor wafers, each semiconductor wafer comprising:
a plurality of semiconductor die processed in clusters into the semiconductor wafer;
a plurality of cavities, one of the plurality of cavities formed in each cluster on the semiconductor wafer;
a plurality of optical modules, one of the plurality of the optical module mounted in each of the plurality of cavities, and configured to transfer data to and from the plurality of semiconductor die using light signals; and
a plurality of controller die, one of the plurality of the controller die mounted in each of the plurality of cavities, and configured to control the transfer of data to and from the plurality of semiconductor die; and
a plurality of contact pads in each of the plurality of cavities, the plurality of contact pads electrically coupled to at least one of the plurality of optical modules and the plurality of controller die.

18. The semiconductor device of claim 17, wherein a group of the plurality of optical modules are provided in successive layers of the plurality of stacked wafers and axially aligned with each other along an axis perpendicular to a surface of the wafers, the group of optical modules transmitting light to each other along the axis through the plurality of wafers.

19. The semiconductor device of claim 17, further comprising one or more metal interconnects extending between the plurality of semiconductor die in the plurality of contact pads in the plurality of cavities.

20. The semiconductor device of claim 17, wherein at least one of the plurality of optical modules and the plurality of controller die are electrically coupled to the plurality of contact pads in a flip-chip configuration.

21. The semiconductor device of claim 17, wherein at least one of the plurality of optical modules and the plurality of controller die are electrically coupled to the plurality of contact pads using wire bonds.

* * * * *